US005118300A

United States Patent [19]
Zarreii

[11] Patent Number: 5,118,300
[45] Date of Patent: Jun. 2, 1992

[54] ACTIVE ELECTRICAL CONNECTOR

[75] Inventor: Mansour Zarreii, Mechanicsburg, Pa.

[73] Assignee: AMP Incorporated, Harrisburg, Pa.

[21] Appl. No.: 705,716

[22] Filed: May 23, 1991

[51] Int. Cl.$^5$ .............................. H01R 9/09
[52] U.S. Cl. ...................... 439/79; 439/66; 439/74; 439/331; 439/751; 439/931
[58] Field of Search .............. 439/61, 62, 79, 80, 439/66, 76, 74, 620, 65, 931, 331

[56] References Cited

U.S. PATENT DOCUMENTS

| 3,629,185 | 12/1971 | Schneble, Jr. et al. | 260/40 R |
|---|---|---|---|
| 3,643,201 | 2/1972 | Harwood. | |
| 3,745,045 | 7/1973 | Brenneman et al. | 117/212 |
| 3,985,413 | 10/1976 | Evans. | |
| 4,186,982 | 2/1980 | Cobaugh et al. | |
| 4,206,962 | 6/1980 | Shue, Jr. et al. | |
| 4,511,597 | 4/1985 | Teng et al. | 427/53.1 |
| 4,532,152 | 7/1985 | Elarde | 427/96 |
| 4,583,807 | 4/1986 | Kaufman et al. | |
| 4,588,456 | 5/1986 | Dery et al. | 156/52 |
| 4,603,320 | 7/1986 | Farago | 340/347 DD |
| 4,604,799 | 8/1986 | Gurol | 29/897 |
| 4,676,565 | 6/1987 | Reichardt | 439/79 |
| 4,686,506 | 8/1987 | Farago | 340/347 DD |
| 4,764,122 | 8/1988 | Sorel et al. | 439/66 |
| 4,772,225 | 9/1988 | Ulery | 439/620 |
| 4,789,847 | 12/1988 | Sakamoto | 439/607 |
| 4,872,844 | 10/1989 | Grebe et al. | 439/69 |
| 4,993,956 | 2/1991 | Pickles et al. | 439/76 |
| 5,046,955 | 9/1991 | Olsson | 439/74 |

OTHER PUBLICATIONS

AMP Catalog 85-774 "Ampliflex Surface-To-Surface Resilient Connectors" Dec., 1985; AMP Incorporated, Harrisburg, PA.

Primary Examiner—Neil Abrams
Attorney, Agent, or Firm—Anton P. Ness

[57] ABSTRACT

An active connector (110,160) including a first dielectric body (112,162) having an L shape and having two arrays of pin contacts having pin portions extending outwardly from mounting surfaces which intersect at a right angle for the connector to be disposed in the corner of circuit elements (12,20) also at right angles, with the pins connected to circuits of the circuit elements. The first dielectric body (112,162) includes conductive paths extending to aligned arrays of pads along the two edge surfaces (122,124) remote from the inside corner, the edge surfaces being coplanar defining a plane traversing the L shape. A second dielectric body (152,200) having a chip (24,24') thereon traverses the inside corner between the edge surfaces, so that contact means of the chip or of the second body connected to the chip contacts, are connected to corresponding pads on the angled edge surfaces of the first body (112,162) thus interconnecting and modifying the circuits of the two circuit elements (12,20) while being easily demountable and replaceable.

22 Claims, 10 Drawing Sheets

ACTIVE ELECTRICAL CONNECTOR

This invention relates to electrical connectors, assemblies and systems for interconnecting circuit paths such as between printed circuit boards where the signals are comprised of digital pulses having fast rise times, and more particularly connectors including electronic components thereon.

BACKGROUND OF THE INVENTION

The trend toward higher speeds for data transmission and manipulation with respect to computers, business machines, and like devices is fast rendering long established designs for connectors and printed circuit board assemblies obsolete. A reason for this is that as data transmission has become digital the rise time of the digital pulses has increased, from milliseconds to nanoseconds (nS). This has led to the various parameters, including resistance (R), inductance (L), and capacitance (C) of the various conductive and dielectric components in printed circuit boards and connectors having a greater affect on signal propagation, delay, signal reflections, and cross-talk between circuit paths, as well as a host of new phenomena adversely affecting signal transmission. The problem is aggravated because in certain widely-used multi-bused architectures such as the versatile backplane bus (VBE) approach, the various conductive path geometries, spacings, path lengths, turns and twists of conductive traces cannot be made equal and thus cannot be made to respond to high-speed pulses in the same way. This problem affects any bus architectures where multiple daughter cards are interconnected through a backplane. Additionally, these differences cannot readily be practically compensated for by tradition techniques. Differences in characteristic impedance ($Z_0$), differences in propagation delay ($T_{pd}$) as well as traditional values of R, L, and C all work together to limit transmission speeds within boards and through connectors.

U.S. Pat. No. 3,643,201 granted Feb. 15, 1972 is directed toward the problem mentioned above and utilizes impedance matching and microstrip concepts to interconnect circuit boards through a two-piece connector utilizing signal and ground planes and spacings to maintain an impedance match throughout the circuit. Unfortunately, with respect to many standard bus structures, microstrip techniques and impedance matching frequently can not be employed. In most standard bus systems, a given bus "sees" a wide variety of stubs in the form of connector/daughter board ensembles which are each different in terms of components, loading, lengths, and geometries of paths and so forth.

Accordingly, it is an object of the present invention to provide an interconnection concept, including a connector structure and board assembly which facilitates interconnection of circuit paths or digital pulses having high speed characteristics. It is a further object to provide an interconnection assembly capable of handling fast rise time digital pulses with minimum reflection and pulse distortion.

It is still a further object to provide a novel system having bulk conductive and dielectric constituents which minimize, in a quantitative sense, the bulk values of R, L, and C of the interconnection circuit paths and further operate in a qualitative sense to decrease signal delays of signals propagated through the interconnection structure.

It is yet another object to provide a novel connector structure utilizing conventional, low-cost plastic materials in conjunction with readily formed conductive paths to improve connector performance relative to traditional constructions, including the saving of space on boards and the facilitation of placement of transceiver elements or other active devices proximate to, and in one embodiment, within a connector structure to facilitate high speed signal transmission.

SUMMARY OF THE INVENTION

The present invention achieves the foregoing objectives and overcomes the problems outlined in the background of the invention by the provision of a connector made to include circuit paths, each of a minimum length and of a geometry and position, relative to a plastic housing, to minimize the effects of the connector on digital pulses transmitted therethrough. The connector of the invention is adapted to include at least one transceiver element or other active device mounted thereon which is interposed along at least some of the circuits of two circuit elements to be interconnected. The connector includes a housing molded of standard thermoplastic engineering material of a type having characteristics suitable for plating or coating with conductive material. The connector includes two arrays of cavities which are plated with circuit paths extending out of such cavities across two surfaces of the connector to define two arrays of contact pads to be electrically connected to the active device. A compliant spring end portion of a contact is inserted in each cavity of each array so that a contact section at the other end is at least exposed along one of two outer or board proximate faces of the connector. Such contact section may be a post extending outwardly to be received within socket contact means of a connector mounted on a first circuit element such as a mother board, or to be received within a through-hole of a second circuit element such as a daughter board and soldered to a circuit path thereof.

The use of plated or coated circuit paths placed directly on the connector substantially reduces the R, L, and C values and thereby the propagation delays inherent in prior art connectors having stamped and formed terminals with free-standing tails bent at right angles to be inserted in daughter card printed-through holes at one end, and into mother board connector socket terminals at the other end. The present active connector, by virtue of the disposition of the conductive paths formed thereon, saves substantial board space and allows the positioning of transceiver chips or other active devices proximate to the connector to further reduce the effects of circuit board paths, vias and relatively long lengths, turns, and transitions used in conventional board manufacturing. The connector preferably includes additional circuits directly connecting associated contacts of the two arrays and bypassing the active device; certain ones of the bypass circuits can additionally be connected to the active device such as to provide power or ground connections thereto rather than have the transmission through the circuit acted upon by the active device.

In one version of the invention, the connector includes a dielectric insert secured to the board-remote surfaces which is given a geometry so as to incorporate leaded transceiver chips or other leaded active devices onto an outwardly facing surface with the leads thereof connected to the plated or coated conductive paths of the connector leading directly to contact pins or other means of interconnecting daughter boards to mother boards through the connector. In another version a circuit element having transceiver chips or other devices can be clamped to the connector and removable therefrom with circuits of the circuit element pressed against conductive means of a pair of resilient connectors mounted along edges of the connector in engagement with the plated or coated paths of the connector leading to the contact pins.

The present invention provides for integration of active devices or other components into the circuits connected between daughter board and mother board involving substantially less real estate or surface area of the daughter board, and also in a manner permitting removal of the device and replacement if desired, without desoldering and resoldering directly involving the daughter board.

This integration of transceiver chips into the connector additionally reduces the variability from daughter board to mother board of the various circuit parameters heretofore experienced with prior art assemblies and packages based on prior art connector constructions.

Embodiments of the present invention will now be described by way of example with reference to the accompanying drawings.

DETAILED DESCRIPTION OF THE INVENTION

Figure 1:
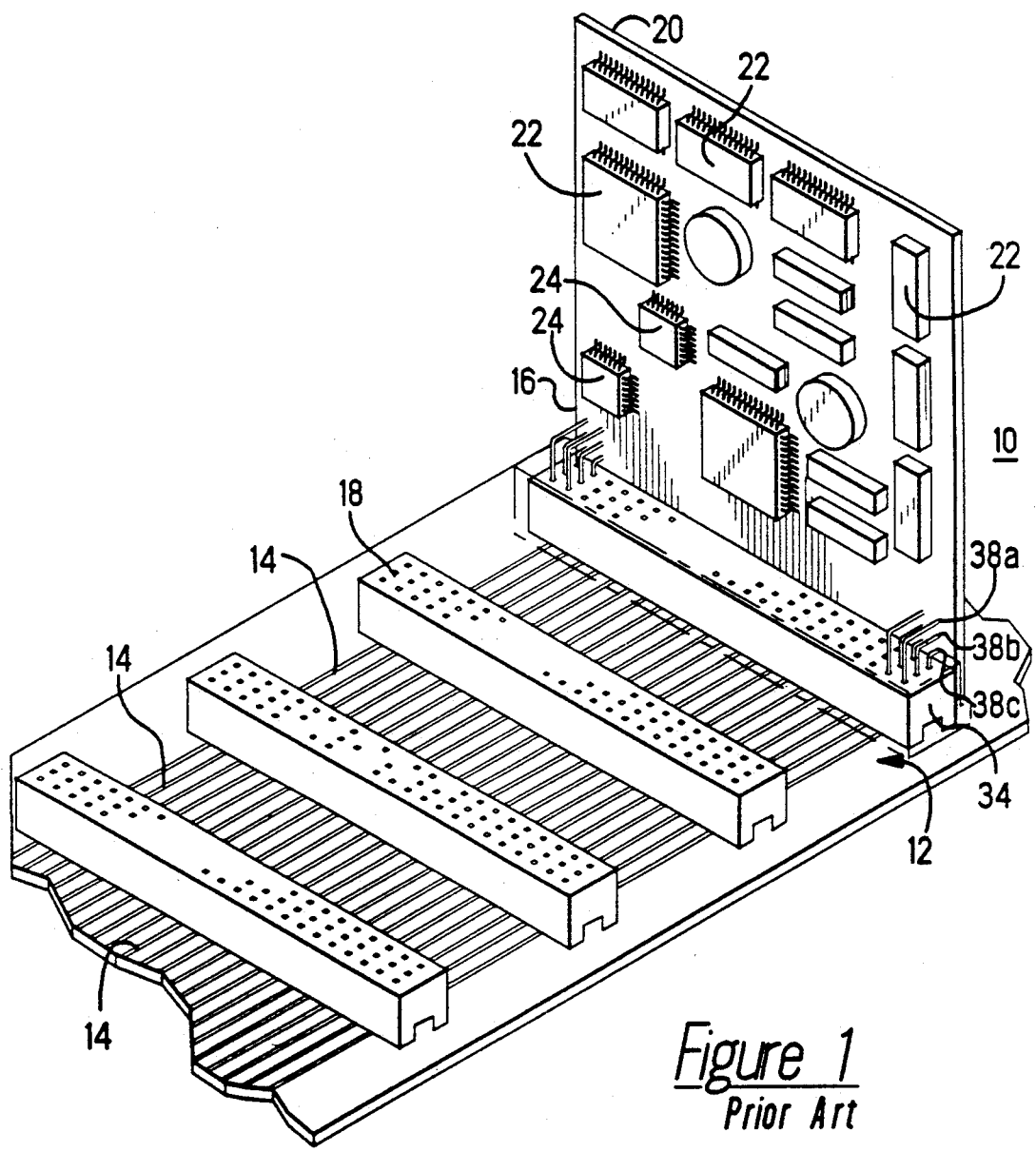
FIG. 1 is a perspective showing a conventional arrangement of daughter board, mother board, connectors and components.

In FIG. 1, an assembly 10 is shown which typifies a widespread multi-bus computer architecture. The assembly includes a mother board 12 containing therewithin multiple buses 14 which are terminated to positions along the surface of board 12 called slots or stubs 16. Each of stubs 16 includes a connector 18 mounted on the surface of board 12, a mating connector shown as 34, a daughter board 20 containing numerous circuits and components to perform desired functions; only one such daughter board 20 is shown.

Reference is made to a publication "Versatile Backplane Bus, ANSI/IEEE Standard 10H-1987" published by the IEEE, New York, N.Y., copyright 1988, for a description of one type of architecture under discussion, although in principle, most multicard systems with backplanes are constructed similarly.

Figure 2:
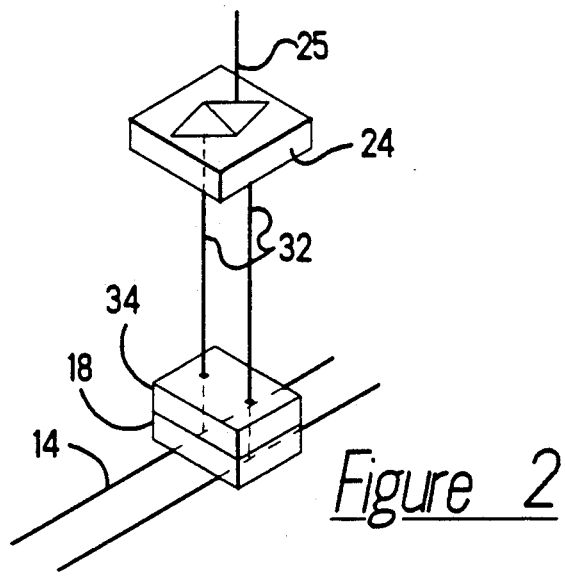
FIG. 2 is a schematic of a portion of the circuit of the arrangement in FIG. 1 shown in perspective.

Daughter board 20 includes, for example, components 22 which may represent integrated circuits performing logic or memory functions, as well as many other components including transceiver chips 24 which receive and transmit signals passed through buses 14, connectors 18, connectors 34, and various conductive paths within daughter board 20. FIG. 2 represents this arrangement with bus 14 being seen as interconnected via connectors 18 and 34 to conductive paths 32 and transceiver element 24. Leads 25 from transceiver element 24 would then be interconnected to the components being driven by or driving element 24.

Figure 3:
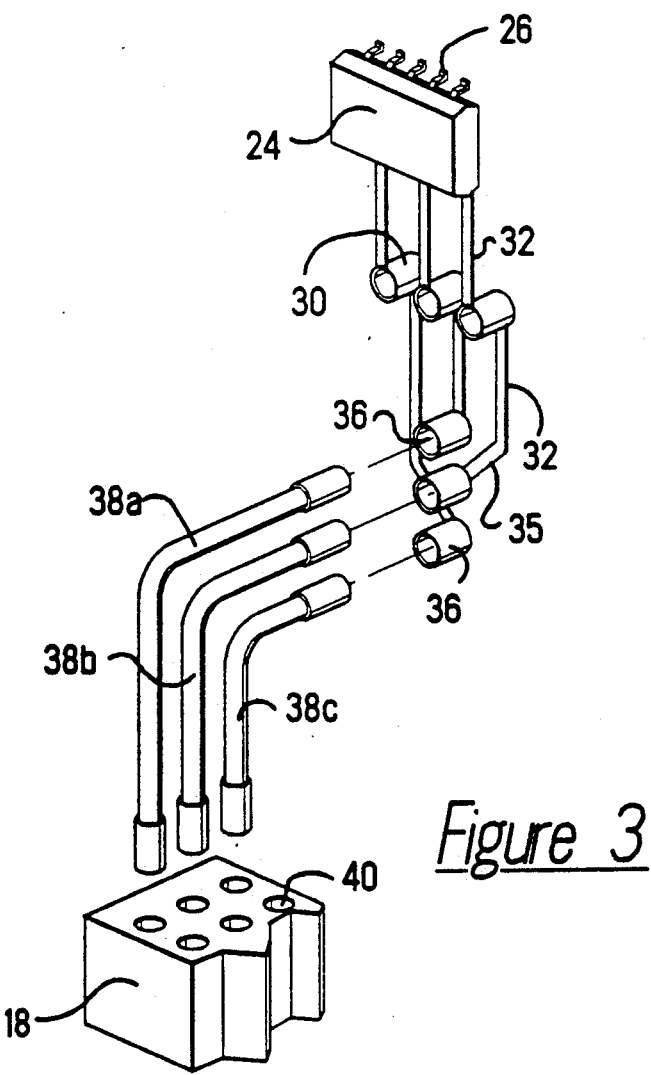
FIG. 3 is a schematic showing in perspective the conductive components forming a typical circuit path, with dielectric support material removed for clarity.
Figure 4:
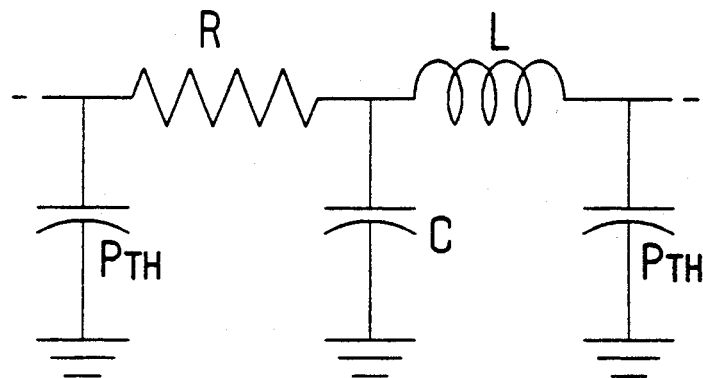
FIG. 4 is a schematic diagram of R, L, and C representing these parameters relative to the arrangement shown in FIG. 1.
Figure 5:
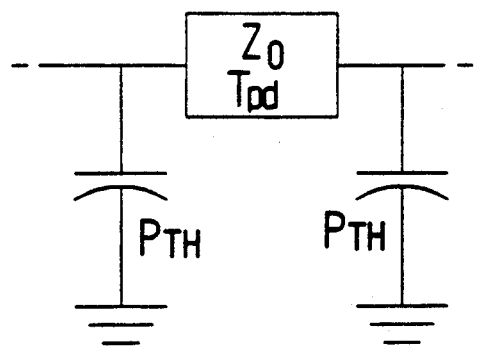
FIG. 5 is a schematic showing the Z of the circuit in relation to capacitances formed by plated-through holes ($P_{th}$)

FIG. 3 represents the physical conductive paths forming the circuit shown in FIG. 2, and FIGS. 4 and 5 represent the electrical schematic diagrams for such circuits. It is important to realize that each of the components forming the conductive paths makes a contribution to the overall circuit "seen" by signals passing to and from the bus 14, the connectors 18 and 34, the various leads therefrom, and the traces from within daughter board 20. Thus, for example, referring to FIG. 3 daughter board 20 includes transceiver chip 24 having leads 25 which plug into and are soldered to or otherwise interconnected to plated-through holes 30 which are electrically connected to conductive paths 32 formed within daughter board 20, within laminated dielectric layers. Paths 32 extend through various bends such as at 35 to join further plated-through holes 36 in a pattern, typically in a row to be interconnected to the contacts of connector 34, three of which are shown as 38a, 38b, 38c in FIGS. 1 and 3. These contacts include bends as indicated and terminate in pin portions which plug into receptacle contacts 40 within the connectors 18. Receptacle contacts 40 are in turn interconnected to the conductive paths of buses 14.

A signal passing along a bus 14 "sees" all of these various elements in terms of R, L, and C, the capacitance of the plated-through holes being represented in FIGS. 4 and 5 as $P_{th}$. The signals on buses 14 thus experience a combination of these parameters forming a characteristic impedance $Z_0$ which effects the propagation delays $T_{pd}$ of the signals passing through the various conductive paths and plated-through holes to reach transceiver chip 24.

Figure 6:
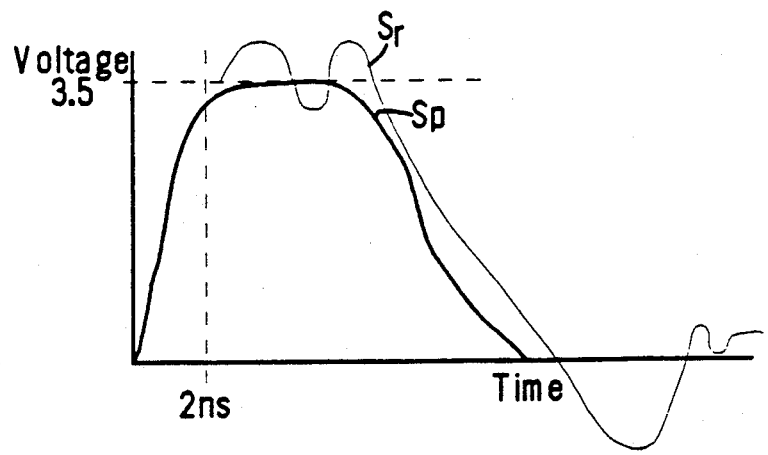
FIG. 6 is a voltage/time plot evidencing an idealized signal pulse trace and also a more typical signal pulse resulting from R, L, and C parameters.

FIG. 6 shows solidly as at $S_p$ a high rise time signal pulse, the rise time being shown as 2 nS which is idealized in terms of characteristic shape; i.e., the pulse appears as it was generated. Also shown is a pulse $S_r$ which represents what in fact may happen to the idealized shape as it passes through the various conductive paths and is exposed to the various R, L, and C parameters. As can be seen, there is a certain ringing that occurs in the form of overshoot at the top of the pulse and a further ringing that occurs which is termed undershoot at the tail end of the pulse.

Figure 7:
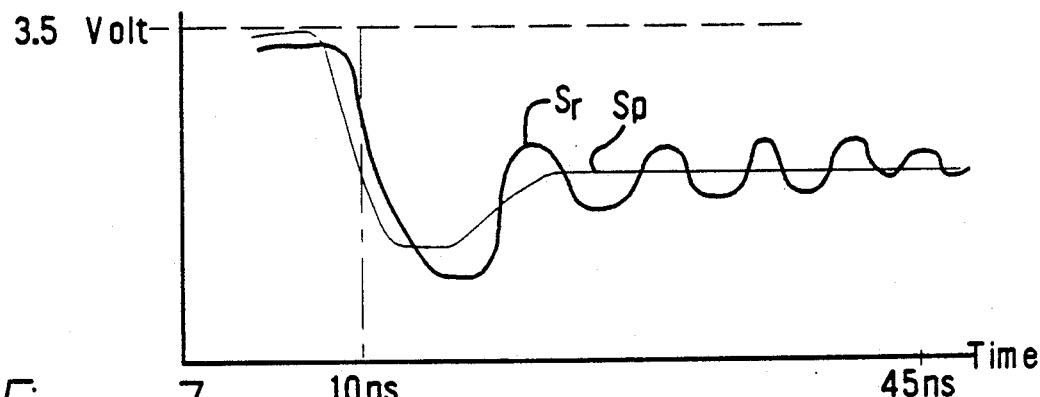
FIG. 7 is a voltage/time plot showing signal transition from high to low, idealized and typical.
Figure 8:
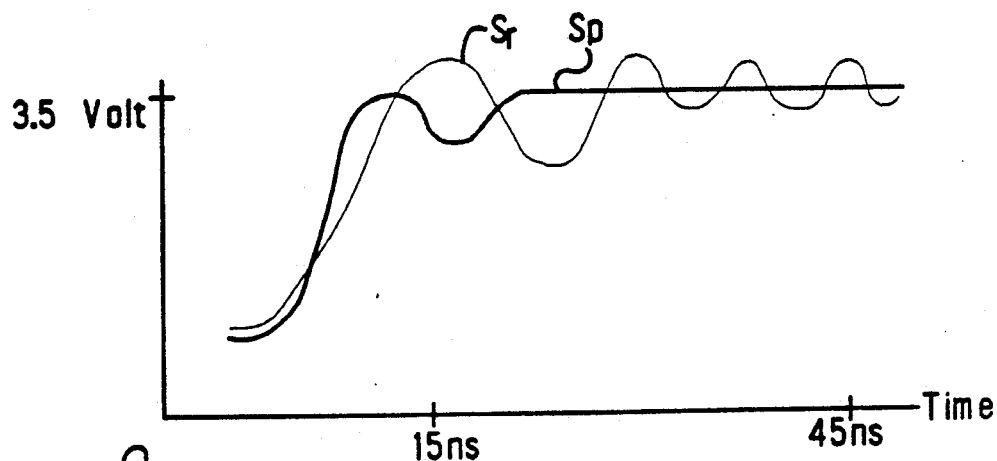
FIG. 8 is a voltage/time plot showing a voltage transition from low to high, idealized and typical of actual practice.

FIG. 7 shows a voltage transition, idealized as at $S_p$ or typical as at $S_r$ for a voltage transition from high to low. FIG. 8 shows similar curves in a transition from low to high. To be noted in FIGS. 7 and 8 are the transition times which are, respectively, on the order of 10 nS and 15 nS and the times taken to reach stability which are on the order of 45 nS in the Figures.

The purpose of transceiver chip 24 is to isolate or deload buses 14 from the stubs formed by daughter boards 20 and the various circuit components thereon as well as the circuits therein. It does this by isolating the effects of impedance on the circuits connected to the chip. As can be discerned from FIG. 3, the conductive paths and plated-through holes between chip 24 and buses 14 thus become even more important as variables affecting signal transmission to and from buses 14 by causing the effects shown in FIGS. 6 to 8. The degree to which transmission transitions from high to low and low to high can be made as well as the length of time the signal takes to become stable all dictate how fast a given architecture can be driven and how fast in turn it can drive the buses 14 and perform the various functions.

Another aspect of this problem is now appreciated in that in typical practice, boards 20 are laid out and provided with components to perform certain circuit functions with the various chips and logic and memory devices typically being different and differently positioned on the boards, along with the various transceiver chips. In times past with pulse rise times on the order of milliseconds, the prior art practice of positioning components and board layout was less critical. With high rise time pulses like that shown in FIG. 6, the layout becomes very critical.

In U.S. Pat. No. 4,583,807 granted Apr. 22, 1986, a daughter board connector is shown wherein the contact elements for a surface-mounted right angle connector, those equivalent to the contact elements 38a,38b,38c shown in FIG. 1 and in FIG. 3 are each given different thicknesses in an attempt to hold the resistances of the conductive paths of the several rows of contacts to be identical.

U.S. Pat. No. 4,676,565 granted Jun. 30, 1987 shows a connector for a similar use with respect to a daughter board wherein the connector contacts have tails or bends comparable to those shown in the previously mentioned patent, the equivalent represented by elements 38a,38b,38c in FIGS. 1 and 3, with bends to place the contacts close to the rear face of the connector housing. One advantage of this is taught as being the reduction of the shadow or footprint of the connector upon the printed circuit board reducing the amount of space occupied by the connector.

Both of the foregoing prior art patents mention relatively high numbers of contacts for such connectors as for example ninety-six contacts in three rows which must be employed to accommodate circuit boards. Both also evidence the need for attention on the one hand to electrical parameters and on the other hand to space saving features in connectors.

Figure 9:
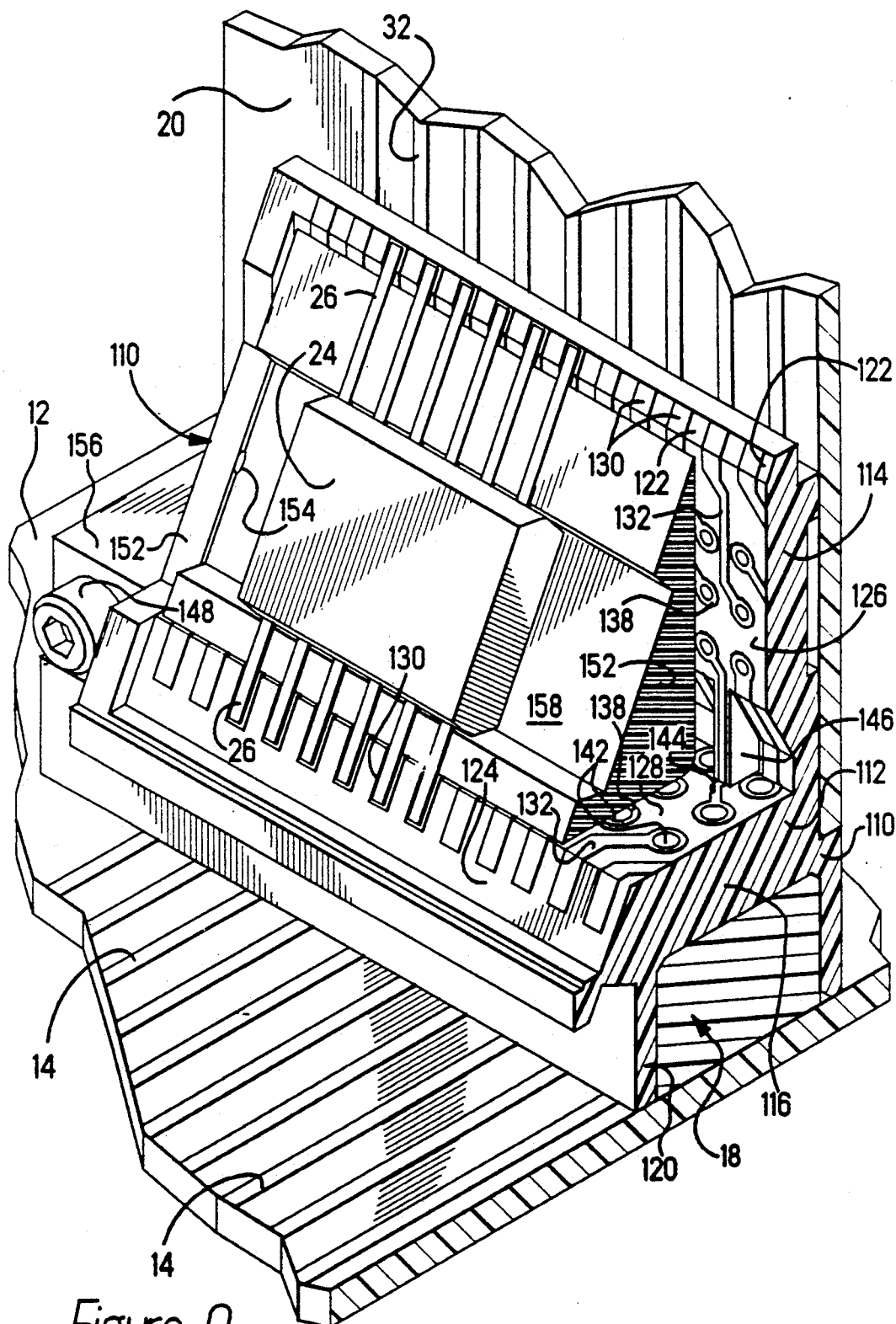
FIG. 9 is a perspective showing part of one embodiment of the connector of the invention incorporating an integrated circuit device therein.
Figure 10:
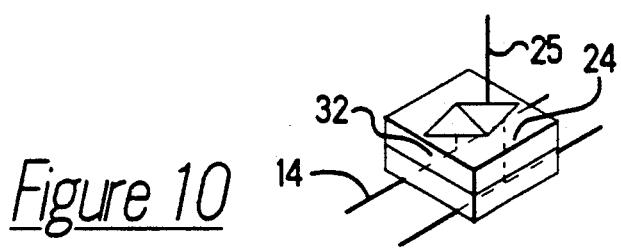
FIG. 10 is a schematic showing the electrical aspects of the circuit formed by the connector, mother board and daughter board as shown in FIG. 9.
Figure 13:
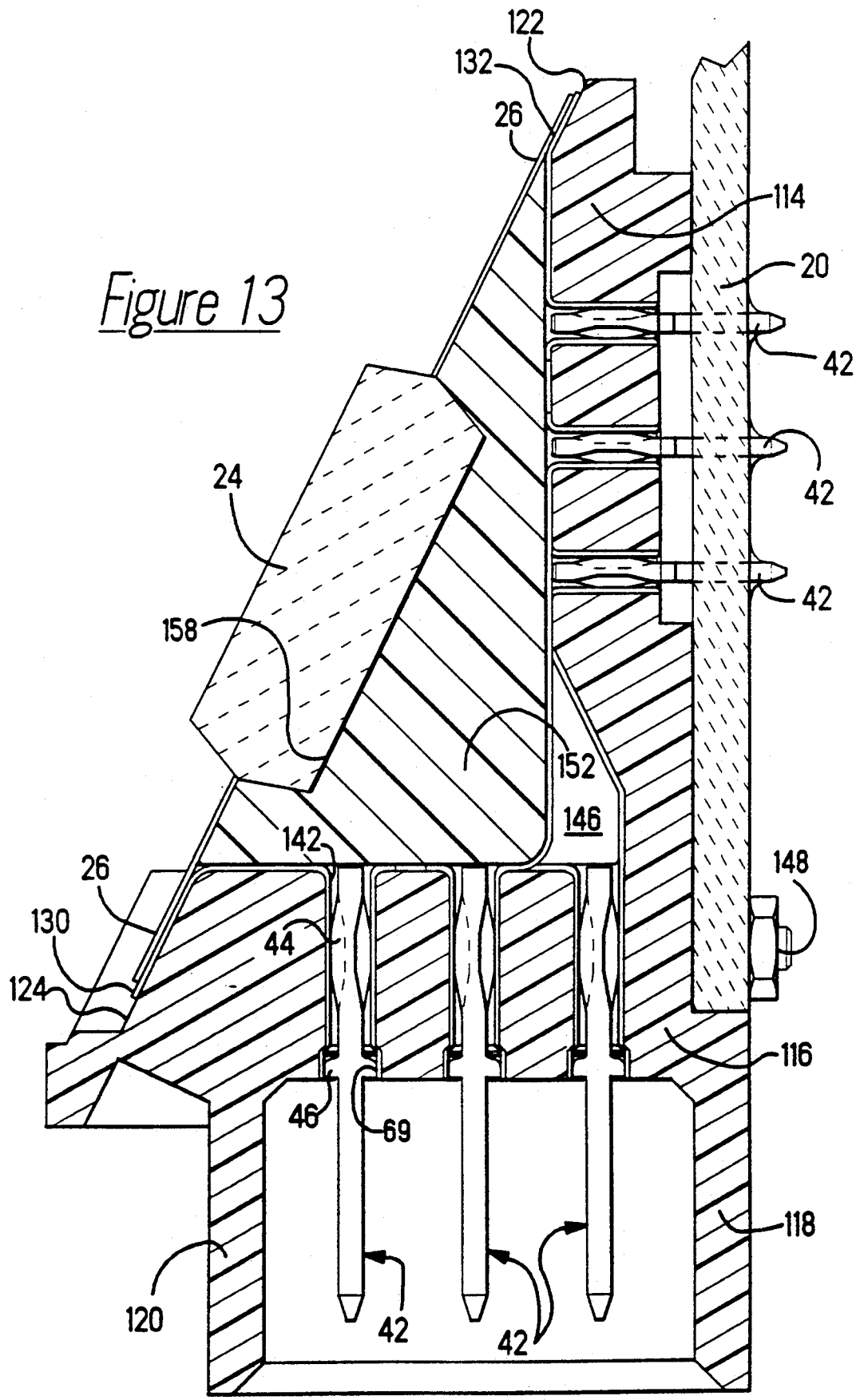
FIG. 13 is a sectional view of the connector shown in FIG. 9.
Figure 14:
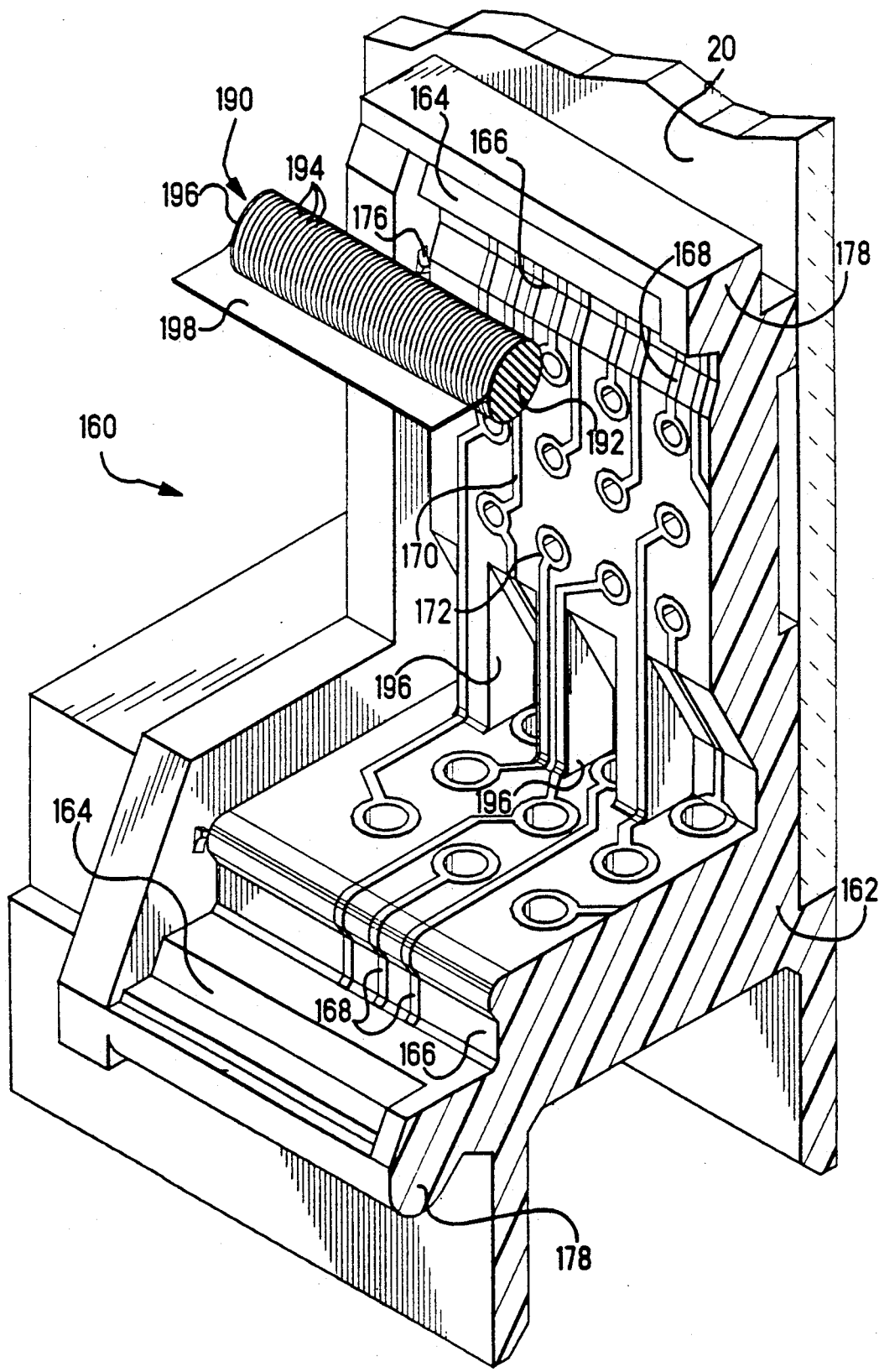
FIG. 14 is a perspective of a second version of the connector utilizing elastomeric connectors, an end portion shown, and one of the elastomeric elements exploded to reveal details.
Figure 15:
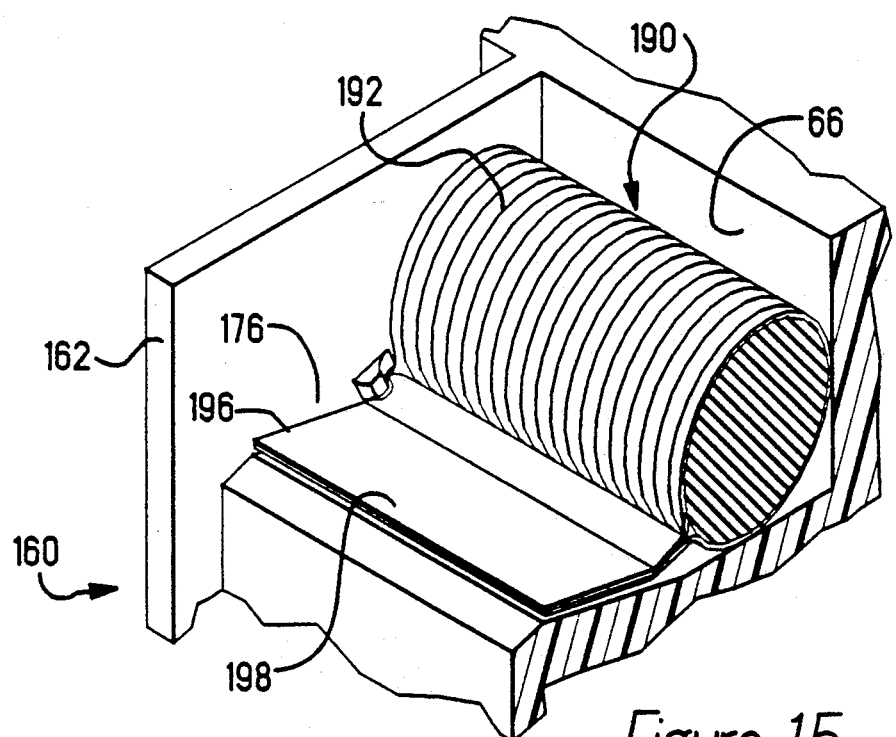
FIG. 15 is an enlarged perspective view of a portion of FIG. 14 showing the retention of one end of an elastomeric connector to the housing.

For applications wherein the pulse rise times are on the order of 2 nanoseconds, or even slightly less, the invention contemplates both the embodiment shown in FIGS. 9, 10 and 13 and that shown in FIGS. 14 and 15. With respect to FIG. 9, mother board 12, buses 14, connector 18 and daughter board 20 can be discerned in relation to a connector 110 which is formed of a plastic material suitable for plating or printing upon to form conductive paths thereon. Connector 110 has a housing 112 with an upstanding portion 114 joining a transverse portion 116 and shroud 118. Shroud 118 defines a cavity and surrounds pin portions extending outwardly from their respective cavities 140 and also surround, align, and guide connector 110 relative to engagement with the outer walls of connector 18 mounted on board 12 in FIG. 1 during mating therewith. On the upper surface of the connector housing are surfaces 122 and 124 which lead to interior surfaces 126 and 128. Rows of pads such as 130 are formed on surfaces 122 and 124 and joined by conductive paths such as 132 which extend on surfaces 126 and 128 to join annular pads 138 leading to conductive material on the surfaces of cavities containing spring portions 44 of contacts 42, shown as 142 in FIG. 13; compliant spring portions 44 engage the conductive coating in the cavity establishing both a retentive interference fit and an assured electrical connection. As an additional feature, the various paths on surfaces 126 and 128 may be made to include jumper or bypass paths 144 which carry common circuits from one surface to the other and therefore from the mother board to the daughter board in terms of circuits. These are typically utilized for extending ground and power through the connector.

FIG. 10, when compared to the schematic of FIG. 2, illustrates the elimination of comparable path lengths represented as 32. The various conductive paths, including plated-through cavities 140 and paths 132 and 144 as well as pads 130 and the annular pads 138 surrounding plated-through cavities 140 may all be formed by first applying a catalyst to such areas, electrolessly plating such areas and then building up the conductive bulk by electroplating. This may be done in a number of ways ranging from printing, silk screening, or utilizing a masking technique which activates selectively a coating on those portions of the housing's surfaces only where plating is desired. Reference is made to U.S. Pat. No. 3,745,045 granted Jul. 10, 1973 for a teaching of a method of selectively applying conductive material into cavities and onto the surfaces of dielectric medium utilizing an ink containing a plating catalyst. U.S. Pat. No. 4,872,844 discloses plating traces on selected surface portions and within cavities of a molded plastic adapter substrate. U.S. Pat. Nos. 3,629,185; 4,511,597; 4,532,152; and 4,604,799 disclose techniques for plating of traces on dielectric surfaces, including using electroless or electroplating techniques, or a combination thereof.

The various paths may be shaped with respect to thickness and height to provide a balance of R as between the different paths. Thus, the long paths can be made thinner or less wide than paths of intermediate length, which in turn can be made restricted relative to the short paths so that the resistance of the three paths is essentially identical. Also in accordance with the invention concept, the spacing between the paths can be controlled to reduce C as much as possible with the bends both in the planes of 126,128 and around the corner between them and about the bend to surfaces 122,124 are radiused to minimize L. In this regard, electropolishing of the conductive path edges to preclude points and sharp radiuses can also be employed to minimize not only quantitative values of C and R, but field fringing effects and the like.

Figure 11:
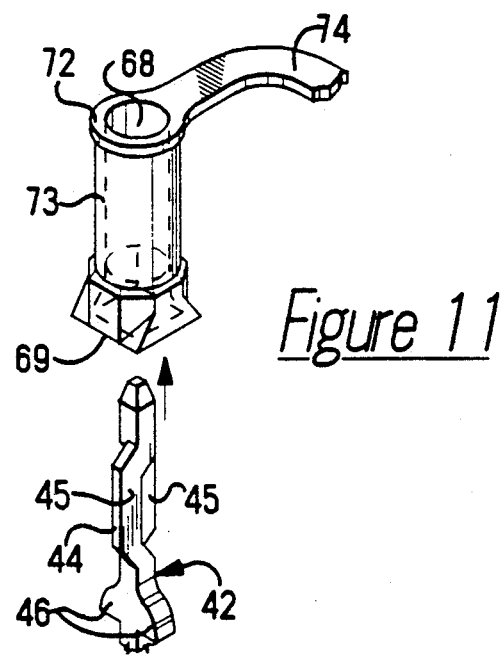
FIG. 11 is a perspective showing portions of the conductive paths of the connector of FIG. 9.

FIG. 11 illustrates a contact 42 having a compliant spring portion 44 similar to that disclosed in U.S. Pat. No. 4,186,982, and a corresponding representative plated through-cavity 73 of a plastic housing which extends to a far surface thereof upon which is disposed a conductive trace or path 74 terminating at annular pad 72 surrounding the entrance to through-cavity 73 and integrally joined to the coating or plating 70 of the inside wall surfaces of the surrounding cavity, with the coating 70 thus defining a tubular geometry shown as 73. Compliant spring portion 44 is dimensioned relative to the interior diameter of 73 to fit therewithin and provide a stable low-resistance interface therewith. An enlarged portion of contact 42 such as laterally extending tabs 46 can engage for example a stop surface defined by an enlarged hole entrance 69 to stop axial movement of contact 42 upon reaching the desired depth of contact insertion.

With respect to the use of plated-through holes in conjunction with the compliant pin as heretofore described, it has been discovered that a compliant pin may be made to work in plastics of a type readily molded to have characteristics allowing the plating thereon if the plated-through cavity is sufficiently thick. Use of compliant pins for retention and electrical connection within plated cavities of a plastic housing is disclosed in U.S. patent application, Ser. No. 07/704,552 filed May 23, 1991 and assigned to the assignee hereof. Preferred plastics are selected for minimal resilience and high stress modulus. For example, the thickness of plating, which may be comprised of copper and electroless nickel to form the thickness of the plating shown in FIG. 11 as 73, is on the order of at least 0.0015 inches. Thicknesses which are the equivalent of one ounce copper are formed to create the conductive paths on the surfaces of the connector and the pads thereon may be employed as well. A pin having a split beam compliant spring section made in accordance with U.S. Pat. No. 4,186,982 and appropriately dimensioned has been formed to provide an excellent elevational interface as well as resisting axial movement. Examples of such compliant pins are sold by AMP Incorporated of Harrisburg, Pa. under the trademark ACTION PIN contacts such as Part Nos. 2-532420-0 (0.025 inch square posts) and 534503-8 (0.015 inch square posts) recommended for use with printed circuit boards of conventional epoxy/fiberglass construction having through-holes drilled therethrough which are then copper plated and tin-lead overplated and have nominal plated diameters of 0.040 and 0.024 inches respectively, and after insertion of the compliant spring section into such a hole with a forty pound force (maximum) the designed retention force range is from at least eight pounds to about twenty-five pounds.

For use with the present invention, it is preferred that for contacts 42 matable with socket contacts of a connector 18, a pair of tabs 46 be formed on each contact to define an enlarged contact portion to be inserted into an enlarged cavity entrance 69 in a substantial interference fit of about two to five pounds until seated against the stop shoulder defined by the smaller diameter of cavity 68, which establishes not only additional resistance to pull-out but also stable axial alignment of contact 42 in passageway 68 since contact 42 will be subjected to stresses during mating with and unmating from contacts of mother board connector 18.

Figure 12:
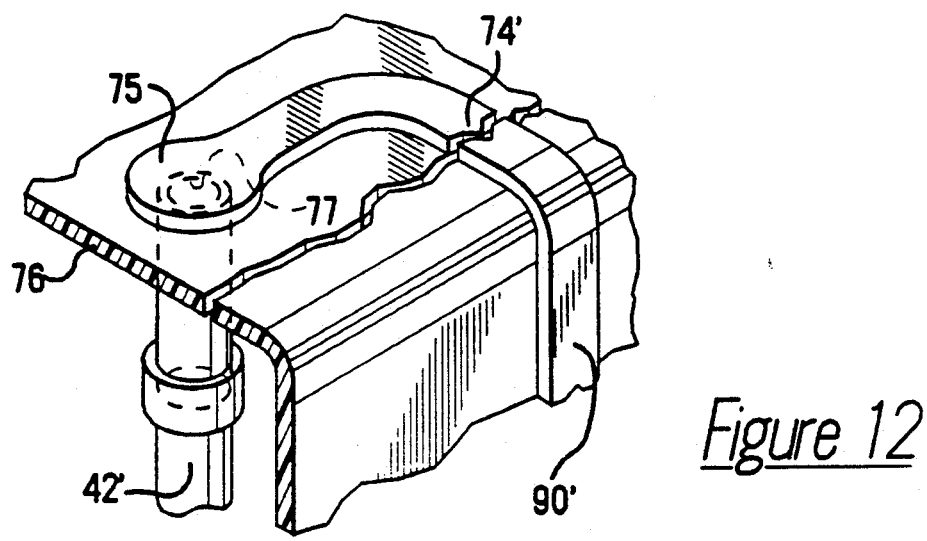
FIG. 12 is a perspective showing an alternative version for forming conductive paths for the connector of FIG. 11.

FIG. 12 shows an alternative construction wherein the conductive paths are formed on a thin plastic film placed directly on the surface of the connector housing, the film then being bonded to such surface. In FIG. 12 the annular pad 72 as shown in FIG. 11 is replaced by a flat solid pad 75 joining path 74' and pad 90' on the surface of a thin film 76. Film 76 may be of a polyester or polyamid material on the order of between 0.002 and 0.005 inches in thickness. Pin contact 42' may, in lieu of the compliant pin, include an upper portion made to extend through film 76 by an aperture 77 shown in phantom in FIG. 12 and be permanently joined to pad 75 in a number of ways, including the use of other conductive adhesive materials, welding, or the like.

One example of a connector for use with compliant pins is fabricated as follows: a housing is molded of a resin selected to result in a molded part having low resilience and high thermal resistance at elevated temperatures such as VECTRA C-810 liquid crystal polymer (trademark of Hoechst Celanese Corp.) to have cavities of unplated diameters of about 0.046 inches; a first layer of conductive material such as copper is electrolessly plated onto all exposed surfaces of the housing including the side walls of the cavities, to a thickness of about 50 microinches after which a plating resist mask is adhered onto the portions of the outer surfaces which are not to be circuits; and a second layer of conductive material such as copper is then electroplated onto exposed surfaces of the first layer to a thickness of about 0.0014 inches after which the plating resist and the underlying portions of the first layer are removed chemically and the circuits remaining preferably being overplated with gold over nickel, with all of the steps generally being by conventional techniques. As a result the inside diameter of each cavity is about 0.041 to 0.045 inches. A compliant pin as disclosed in U.S. Pat. No. 4,186,982, is made of phosphor bronze gold plated with nickel underplating with a post section 0.025 inches on a side, to have an diagonal of about 0.050 inches prior to compression at the spring portion, and a nominal pull-out force of up to about eight to twelve pounds upon insertion into a circuit board through-hole of 0.040 inches nominal inside plated diameter but commonly ranging from 0.037 to 0.043 inches.

An alternate method would be to provide a housing having an ultraviolet sensitive catalyst in the plastic, providing a UV-opaque mask over the noncircuit surface portions of the housing surface, illuminating the housing with ultraviolet light and activating the catalyst in the unmasked regions, cultivating metal ion growth in the unmasked regions, electrolessly plating a thin first layer of copper to the metal ions, and electrolessly plating a thick second layer of copper thereover, defining the circuits.

In the present example such a pin after insertion into the plated cavity of the plastic housing, would have a nominal pull-out force of about 3.5 pounds resulting from the compliant spring compression (and an additional pull-out force of from two to five pounds from the force-fit shoulder 46). The plating material defines a barrel having a strong hoop strength to compress the spring of the compliant pin upon insertion without being substantially deflected or deformed radially outwardly, and has been found not to exhibit microcracks. Microcracks in the plating would ordinarily be expected of plating over plastic structure with plastic materials conventionally used for connector housings because of the resilient nature of the supporting plastic undersurface and standard plating thicknesses, when subjected to such a severe interference fit concentrated at two opposed radial locations by the two legs of the split-beam spring portion of the pin. For a pin with a square post dimensioned 0.015 inches on a side and not having a second force-fit section, such as would be used with daughter board 20, an unplated hole diameter of about 0.0275 inches and a plated hole diameter of about 0.0245 inches would be preferred, with a resultant higher pull-out force of about 4 to 4.5 pounds.

Figure 16:
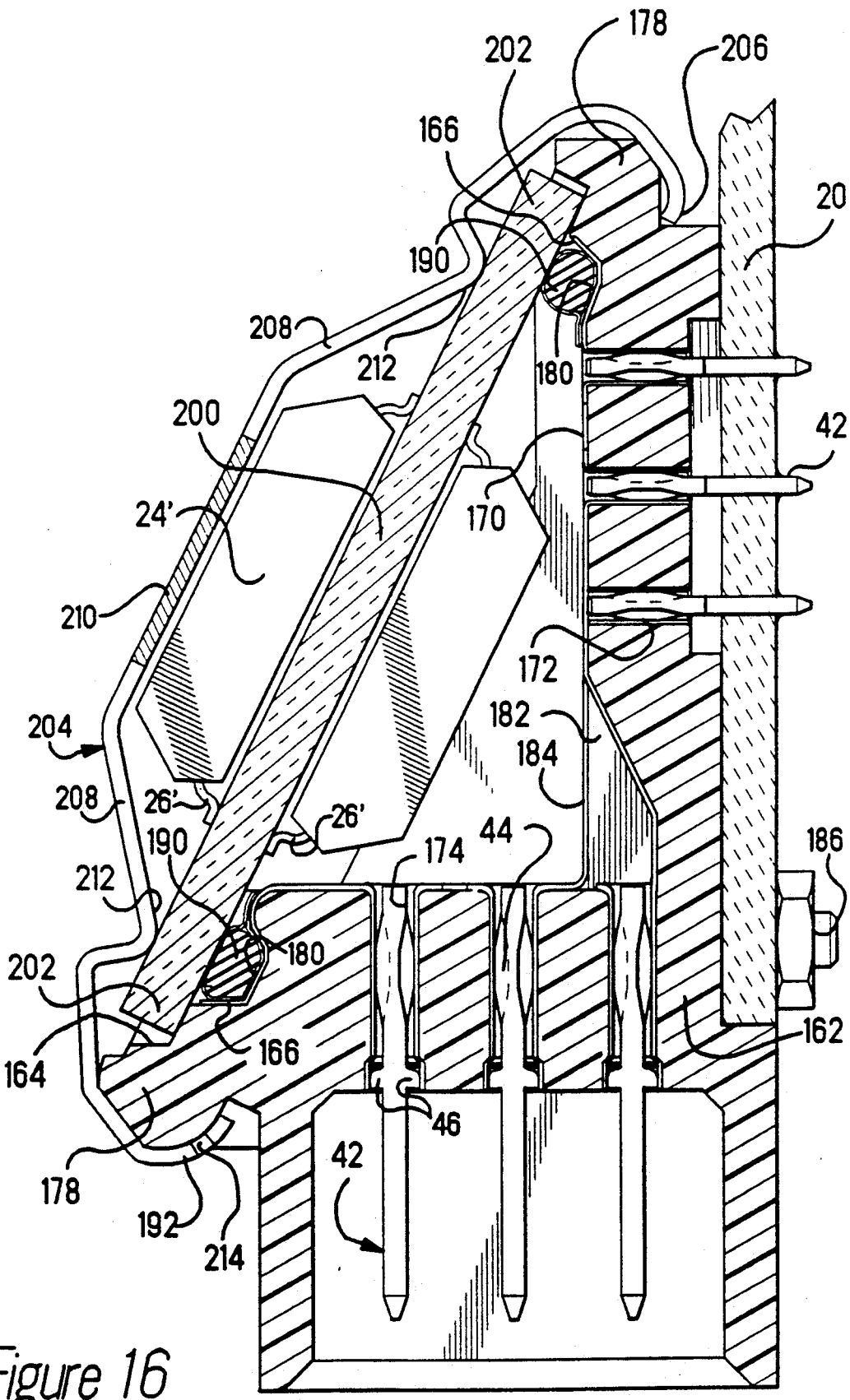
FIG. 16 is an elevational and sectional view of the connector of FIG. 14.

With respect to the embodiments of the invention shown in FIGS. 9 and 13 and also that of FIGS. 14 to 16, the forming of the conductive paths is contemplated as being formed by either additive or subtractive electrochemical processes meaning that the paths may be formed simultaneously for a given connector or in fact for many connectors or etched films to very tight tolerances, formed by processes by the same type utilized to form the printed circuit boards with which the connectors are used. The various geometries possible utilizing the concepts of the invention heretofore described will substantially reduce the R, L, and C, and also the propagation delays associated with signal transmission and yet be fully compatible with existing geometries of mother and daughter boards and widely used bus architecture, the essential change required only relating to the substitution of the connector geometry shown along with the use of conductive elastomers or conductive materials such as adhesives.

Housing 112 of FIGS. 9 and 13 preferably includes a series of reinforcing ribs 146 spaced along the right angle inside corner joining the vertical and horizontal portions 114,116. The outwardly facing edge surface of each rib 146 can preferably have certain ones of jumper or bypass circuit paths 144 defined thereon enabling higher density path definition. Housing 112 is preferably secured to daughter board 20 by bolt fasteners 148 inserted through apertured flanges 150 at each connector end onto which are threaded nuts.

In the embodiment of FIGS. 9 and 13, a second dielectric portion of the connector, triangular cross-section plastic insert 152 is made to fit in and against surfaces 126 and 128 and be secured to housing 112 such as by being latched under latches 154 on end walls 156 of housing 112, and to carry on its upper surface transceiver chips or the like, such as chip 24 having leads 26 and receivable within recess 158. Insert 152 provides dielectric structure insulating exposed circuits and contact ends of housing 112, and further provides support for chip 24 during and after assembly. Surfaces 122,124 are angled with respect to adjoining surfaces 126,128 in such a manner as to substantially be coplanar traversing the right angle bend of L-shaped first connector portion 112 at edges remote from the junction of the L. Leads 26 are interconnected to pads 130 appropriately spaced along surfaces 122,124 with chip 24 optionally bonded in position to plastic insert 152 in a suitable fashion.

The interconnection of the chip leads to the pads may be done in a number of manners, depending upon the nature of the chip packaging. Thus, for example, chip 24 shown in FIG. 9 has flat tabs arrayed in a plane which may be joined by conductive adhesive or held by some suitable means, or may be welded to such paths by conventional integrated circuit tape-automated-bonding techniques; chip 24 may be assembled to connector 110 such as by automated apparatus which will weld leads 26 to contact pads 130 after registration of leads 26 therewith, remaining unattached to insert 152 at least prior to registration and welding. Alternatively, if chip 24 itself includes pads, wire bonding may be employed to join the chip to pads 130. As a result of the foregoing package detail, the transceiver chips will have been incorporated into the connector itself to thus remove the transceiver chips from daughter board 20 and result in the improvement electrically as indicated in FIG. 10 with the greatly reduced R, L, and C and propagation delay with respect to prior art structures.

Reference is now made to FIGS. 14 to 16 where another embodiment is made to include an easily removable transceiver chip and connector to adapt the invention to further alternatives in packaging. There, connector 160 is made to include a housing 162 of plastic material suitable for coating or plating of conductive material in the manner heretofore described. The connector includes on interior surfaces thereof, a pair of spaced apart surfaces 164 adapted to receive a circuit element 200 including one or more transceiver chips 24' thereon having leads 26' soldered surface-mount style to conductive pads of circuit element 200 on circuit paths extending to rows of pads along the lower surface near edges 202 thereof. Adjacent to surfaces 164 are grooves 166 which are made to include conductive pads 168 joining conductive paths 170 which in turn join conductive material 172 extending within cavities 174 within housing 162 to be engaged by compliant spring sections 44 of contacts 42.

Fitted within grooves 166 are connectors 190 which are formed of a cylinder 192 of an elastomeric material having therearound transverse conductive paths 194 spaced therealong and placed on centers spaced more closely together than the spacing of corresponding pads 168 and corresponding pads of circuit element 200 to provide two to three electrical paths therebetween. Surface-to-surface resilient connectors 190 are taught in U.S. Pat. No. 3,985,413 granted Oct. 12, 1976 and are sold under the trademark AMPLIFLEX by AMP Incorporated, Harrisburg, Pa. A sheet of thin flexible film such as of polyimide is wrapped around a soft nonconducting cylindrical core of elastomeric material such as silicone rubber, and etched on outwardly facing surfaces of the film are individual parallel lines of copper circuitry; the copper traces are about 0.003 inches wide and spaced apart about 0.007 inches. Such connectors are resilient to provide a compressibility with a force driving conductive pads 194 outwardly in a manner to interconnect the conductive paths 168 with corresponding traces of circuit element 200. Best seen in FIG. 15, elastomeric connectors 190 may be temporarily secured in rather nonconfining grooves 166 of connector housing 162 by clamping bosses 176 at opposed ends of grooves 166 which impinge into the end faces 196 of elastomeric connectors 190 without causing connectors 190 to warp or arc therealong, such as at the junction of longitudinal tab 198 formed by the bonded ends of the outer film, and the cylindrical pad-carrying portion 192.

Circuit element 200 is shown in FIG. 16 secured to connector housing 162 by a spring clip or bracket 204 which is removably clampable about lateral sides 178 of housing 162 by free ends 206 of arms 208 spaced along a longitudinal body section 210, for example. Bracket 204 is shaped to include clamping portions 212 which engage circuit element 200 near edges 202 thereof when in place, thus urging circuit element 200 firmly against elastomeric connectors 190. With bracket 204 latched in place, circuit element 200 thereby compresses connectors 190 against surfaces of grooves 166 and establish assured electrical connection of the circuit paths of circuit element 200 with corresponding conductive paths 194 of connectors 190 and thereby to conductive paths 168 in grooves 166 of connector housing 162. Preferably grooves 166 include bottom surface portions 180 which are slightly angled (such as 4° outwardly from an orientation parallel to circuit element 200 which may be oriented at an angle of about 64° with mother board 12, thus tending to urge elastomeric connectors 190 farther into relatively nonconfined grooves 166 and tend to assure greater lengths of conductive engagement between contact pads 168 and pads 194. Bracket 204 can be stamped and formed of high spring strength stainless steel, for example, and can include small projections 214 at free ends 206 for prying of arms 208 from edges 178 using a tool such as a screwdriver.

Housing 162 may also include reinforcing ribs 182 (similar to ribs 146 of FIGS. 9 and 13) which may include one and possibly two conductive paths 184 defined on outwardly facing edge surfaces thereof. Connector assembly 160 can be secured to daughter board 20 by fasteners 186 extending through flanges at opposite ends of housing 162, similarly to housing 112 of FIGS. 9 and 13.

The embodiment of the invention shown in FIGS. 14 to 16 thus incorporates one or more transceiver chips into the connector in a manner which allows the ready replacement thereof from the interconnected mother and daughter boards.

The invention heretofore described has emphasized a number of different embodiments with respect to plating, coating, or otherwise forming conductive paths on the surfaces of the connector housings, such paths being bound to such surfaces or to a film which is in turn bound to the surfaces of the connector. The invention contemplates that the various embodiments of forming conductive pads directly on the housing material or on a film may be utilized with the various embodiments incorporating transceiver-chips into the connectors.

A comparative analysis of VME bus performance with transceivers and connectors in accordance with the invention versus a transceiver location in a typical manner on a daughter board was performed simulating standard conductor path parameters. The load slot or stub path was chosen as a three-inch length of a 75 ohm strip line with its values of R, L, and C lumped, the dip package was estimated with the plated-through hole loadings being on the order of 1 pF. The sum of values following connective paths including printed through holes along the lines shown in FIG. 3 had the following result:

R = 3.5 ohms
C = 14.7 pF
L = 46.5 nH
Z = 56 ohms
$T_{pd}$ = 731 picoseconds

Utilizing the invention version using the elastomeric connector as shown in FIGS. 14 and 15 wherein the connector is made to incorporate the transceiver device, the following parameters were obtained in simulation:

R = 1.3 ohms
C = 6.2 pF
L = 21.2 nH
Z = 59 ohms
$T_{pd}$ = 286 picoseconds

As can be discerned from the foregoing, substantial reductions in R, C, and L, as well as, importantly, propagation delay as between the prior art approach and the invention approach. More importantly, the variations in paths implicit in the paths from each of the three rows were significantly reduced as well. Put another way, the path associated with the one row closest to the daughter board was made to have parameters much closer to the path associated with the row farthest away from the board; in some instances, improvements as much as 50 percent in this variation of parameters, and an important consideration for circuit and board design attributed to the connector of the invention.

Having now described the invention in terms intended to enable the preferred practice of the various embodiments thereof, claims are appended intended to define what is inventive.

What is claimed is:

1. A connector for interconnecting multiple circuit paths as between the paths supplied by bus in a mother board through a connector thereon having contacts arranged in multiple rows, said connector being characterized in that the parameters of R, L, C, and propagation delay are critical to signal transmission between said bus and the circuits in said daughter board, the connector comprising:

a dielectric housing containing first and second arrays of cavities and contacts mounted in said cavities in rows along first and second outer mating surfaces to mate with the connector of the mother board and to circuits of the daughter board respectively, said cavities containing conductive material extending onto first and second inner surfaces of said housing opposite to said contacts and being bound to the surfaces to form circuit paths, the conductive material of at least some of said circuit paths extending along said first and second inner surfaces to form spaced contact pads on first and second further surfaces at respective outer edges of said first and second inner surfaces of said housing facing away from surfaces of said mother and daughter boards; and said connector includes means supporting at least one functioning electronic component, said component supporting means adapted to be fitted and mounted against and along said first and second inner surfaces of said housing, and each said component secured along a surface of said supporting means at least spaced from said first and second inner surfaces, contact means of each said component being connected to respective said contact pads on said housing thus interconnecting associated circuit paths of said first and second inner surfaces and contacts extending from said first and second outer mating surfaces to interconnect circuits of said mother and daughter boards, the conductive paths electrically between the contacts and the contact paths of said housing having a geometry adapted to minimize propagation delay between said mother and daughter boards.

2. The connector of claim 1 wherein said conductive material in said cavities is formed of a plating material bound to interior surfaces of said cavities.

3. The connector of claim 1 wherein said conductive material is formed of a plating material bound to the surfaces of said housing.

4. The connector of claim 1 wherein said conductive material on exterior surfaces of said housing is formed on a flat insulating film containing conductive material bound thereto with said film being bound to said housing by an adhesive or the like.

5. The connector of claim 1 wherein said conductive material within said cavities is formed of a plating material and each of said contacts of said connector includes a compliant spring portion compressed by insertion within a said cavity to provide an interconnection with said plating material.

6. The connector of claim 1 wherein said contact pads are joined to pads of a further circuit by a thin layer of conductive material.

7. The connector of claim 6 wherein said conductive material is a conductive elastomer.

8. The connector of claim 7 wherein said conductive material is a conductive adhesive.

9. The connector of claim 6 further including means clamping said connector to a further circuit board to maintain the interconnection between said pads.

10. The connector of claim 1 wherein selected ones of said circuit paths of said first array of cavities are directly interconnected with selected ones of said circuit paths of said second array of cavities.

11. The connector of claim 10 wherein certain of said interconnected selected circuit paths include path portions extending to respective contact pads along said first and second further surfaces to be electrically connected to each said component.

12. The connector of claim 1 wherein said housing has first and second body sections integrally joined at a right angle for interconnecting a daughter board mounted at a right angle to a mother board, and said first and second arrays of cavities are disposed in said first and second body sections.

13. The connector of claim 12 wherein said housing includes a spaced array of strengthening ribs along the inside corner of the integral joint defined by said first and second body sections, and said component supporting means is shaped to be compatible with said strengthening ribs.

14. The connector of claim 1 wherein said component supporting means is a dielectric insert formed to interfit the geometry of said housing along said first and second inner surfaces between said first and second further surfaces.

15. The connector of claim 14 wherein said component is secured along an outwardly facing surface of said dielectric insert and includes leads extending to overlie and be connectable to respective said contact pads on said first and second further surfaces.

16. The connector of claim 1 wherein said component supporting means is a circuit element securable to said housing between said first and second further surfaces and includes circuit paths extending to end portions at least proximate respective said contact pads on said first and second further surfaces, said circuit element having mounted thereon at least one said electronic component electrically connected to said circuit paths of said circuit element.

17. The connector of claim 16 wherein resilient connectors are interposed between edges of said circuit element against circuit path end portions thereof and said contact pads of said first and second further surfaces of said housing, each said resilient connector including conductive pads spaced therealong adjacent and interconnecting corresponding ones of said circuit path end portions and said contact pads upon said circuit element being secured to said housing in a manner compressing said resilient connectors.

18. The connector of claim 17 wherein a bracket means is removably clampable to said housing and having engaging portions engageable with said circuit element in a manner securing said circuit element to said housing and compressing said resilient connectors.

19. A connector for interconnecting circuits of a type using fast rise time digital pulses wherein values of circuit parameters including R, L, C, and propagation delays are critical to signal transmission and propagation, said connector being adapted to be mounted between said circuits and having a housing member molded in one piece of dielectric material and including arrays of contacts adapted to mate with further contacts on said circuits, said housing member including an array of conductive paths, one for each contact with said paths being separated electrically and ending in pads, at least one transceiver chip secured to housing member with contact means of said chip connected to said pads to drive and be driven by said interconnected circuits through said connector to minimize R, L, C, and propagation delay through said connector.

20. The connector of claim 19 wherein said conductive paths are bound to surfaces of said housing member and of a geometry to minimize path length.

21. The connector of claim 19 wherein said arrays of contacts include contacts in different planes with certain of said contacts in a given plane interconnected with certain of said contacts in an other plane by said conductive paths to common circuits for power and/or ground interconnection.

22. The connector of claim 21 wherein said contacts in said given plane interconnect circuits of a daughter board and said contacts of said other plane interconnect circuits of a mother board.

* * * * *